United States Patent [19]

Tsuchiaki

[11] Patent Number: 5,756,391
[45] Date of Patent: May 26, 1998

[54] ANTI-OXIDATION LAYER FORMATION BY CARBON INCORPORATION

[75] Inventor: Masakatsu Tsuchiaki, Fishkill, N.Y.

[73] Assignee: Kabushiki Kaisha Toshiba, Kanagawa-ken, Japan

[21] Appl. No.: 409,819

[22] Filed: Mar. 24, 1995

[51] Int. Cl.$^6$ .................................................. H01L 21/28
[52] U.S. Cl. .......................... 438/592; 438/655; 438/659; 438/931
[58] Field of Search .......................... 437/24, 41, 100, 437/186, 191, 200, 968, 983; 148/DIG. 148; 457/195, 203; 438/592, 655, 659, 931

[56] References Cited

U.S. PATENT DOCUMENTS

| | | | |
|---|---|---|---|
| 3,616,380 | 10/1971 | Lepselter et al. | 204/164 |
| 4,581,627 | 4/1986 | Ueda et al. | 357/67 |
| 4,705,659 | 11/1987 | Bernstein et al. | 264/29.6 |
| 4,729,969 | 3/1988 | Suda et al. | 437/203 |
| 4,939,100 | 7/1990 | Jeuch et al. | 437/203 |
| 5,024,723 | 6/1991 | Goesele et al. | 156/628 |
| 5,395,774 | 3/1995 | Bajor et al. | 437/186 |
| 5,420,056 | 5/1995 | Moslehi | 437/40 |
| 5,431,964 | 7/1995 | Rivoire | 427/535 |

OTHER PUBLICATIONS

S. Wolf, "Silicon Processing for the VLSI Era, vol. 1", Lattice Press, pp. 547–555, 1986.

Kimura et al. "Effect of Mixing Ions on the Formation Process of B–SiC Fabricated by Ion Beam Mixing", Thin Solid Films, vol. 157, pp. 117–127, 1988.

*Primary Examiner*—John Niebling
*Assistant Examiner*—Thomas G. Bilodeau
*Attorney, Agent, or Firm*—Banner & Witcoff, Ltd.

[57] ABSTRACT

The present invention is directed to a method for inhibiting silicon oxidation on a silicon surface by forming a very thin carbon-containing silicon surface layer on the silicon. The silicon surface is exposed to a carbon-containing plasma to form the carbon-containing silicon layer. The carbon treatment also renders he silicon surface slightly amorphous due to ion bombardments from plasma. An oxide free and slightly amorphous silicon surface promotes homogeneous progress of silicidation reaction between the silicon and a metal deposited thereon, which enables thin but smooth and stable silicide film formation. The present invention is also directed to a method for forming uniform silicon layers only on horizontal portions of features on a substrate. A silicon layer is deposited on to conform to all exposed surfaces of a device. The horizontal surfaces are then exposed to a carbon-containing plasma to form anti-oxidation layers on the horizontal surfaces. Successive oxidation can then proceed selectively on the vertical portions of the silicon. Each horizontal silicon layer at different level remains intact and is electrically isolated each other.

6 Claims, 9 Drawing Sheets

ANTI-OXIDATION LAYER FORMATION BY CARBON INCORPORATION

This invention relates to forming an anti-oxidation layer on a silicon surface. More particularly, this invention relates to forming a very thin carbon-containing layer on a silicon surface by exposing the surface to a carbon-containing plasma to inhibit progression of oxidation on the surface. The formation of this anti-oxidation layer is particularly useful as a surface treatment of silicon wafers prior to silicidation process (i.e., a reaction to form an alloy between the silicon and certain metals deposited on the silicon surface) to realize small geometry high, speed silicon devices. The resent invention is also directed to a method for preferentially forming anti-oxidation layers on horizontal surfaces of exposed silicon features, which simplifies fabrication processes of elevated source/drain MOSFETs (Metal/Oxide/Semiconductor Field Effect Transistors) structures.

BACKGROUND OF THE INVENTION

The geometry of individual silicon devices (such as MOSFETs and Bipolar Transistors) is continually being scaled down in pursuit of high performance and high packing density in ultra large scale integrated circuits (ULSI). Accordingly, the individual features of such devices are also being scaled down including diffusion layers and the depth of such layers. A diffusion layer is formed by introducing impurity(ies) of a specific conductivity into a region having the opposite conductivity in a silicon wafer. This creates a p-n or n-p junction. Thinner diffusion layers cause higher electrical resistance to electrical current flowing in the layers, therefore delaying propagation of electric signals. In order to obtain high speed operation, which is a very desirable attribute for high performance ULSIs, it is critical to reduce this resistance.

One promising approach to alleviate high electric resistance in a thin silicon diffusion layer is to form an alloy between the silicon in the silicon diffusion layer and a metal deposited on top of the silicon diffusion layer (silicidation). The alloy (silicide) has significantly lower resistivity than the silicon in the silicon diffusion layer and provides a less resistive electrical current path.

Because silicidation consumes the diffusion layer to form an alloy, a thick silicide layer having a rough interface with the diffusion layer could result in silicide penetration through the diffusion layer into the underlying silicon region. Such a penetration will open up an undesired current path through the junction between the diffusion layer and the underlying silicon region. The diffusion layer will not be able to confine the electrical current which defeats the purpose of having a diffusion layer. Even a single penetration in one junction in a device having multiple junctions will disable the device and cripple the entire ULSI circuitry. Thus, it is vital to form a thin but smooth and stable silicide film on a thin silicon diffusion layer. However, there are at least two major obstacles to obtaining such a thin but smooth and stable silicide film on the silicon diffusion layer.

First, a thin $SiO_2$ layer is inevitably formed on the silicon surface of the diffusion layer once the surface is exposed to oxygen-containing ambient, including atmosphere at room temperature. The $SiO_2$ layer formed is typically fragile, inhomogeneous and full of discontinuities or weak (thin) spots. Since metals having a low affinity to $SiO_2$ (such as Co, Ni, Mo, W, Pt) do not react with $SiO_2$, even a thin $SiO_2$ layer existing between the silicon and the deposited metal will block a silicidation reaction. Thus, the $SiO_2$ film will block the silicidation reaction or limit it to local spurs at weak spots and also cause an irregular interface to form between the silicide and diffusion layers. Even for metals which are capable of reducing $SiO_2$ (such as Ti), such an inhomogeneous $SiO_2$ layer on the silicon surface will affect homogeneous initiation of the silicidation reaction because reaction rates between the metals and $SiO_2$ are much slower than the reaction rates between the metals and the silicon.

Second, the crystalline nature of silicon in a diffusion layer will result in adverse effects. Unlike an amorphous structure, which is of random atomic configuration hence isotropic, a crystalline structure is highly anisotropic. The free energy of the interface between silicide and silicon as well as the diffusivity of metal and silicon depend on crystallinity of the silicon. As a result, some silicidation processes (such as NiSi formation) tend to progress along one preferred crystal plane (e.g., (111) plane). If industrial standard (100) wafers are used, the preferential progress of silicidation along a specific crystalline plane results in protrusion of silicide into the silicon along a non-horizontal plane. As discussed above, silicide penetrating the junction between the silicon diffusion layer and underlying silicon is detrimental to shallow junctions because it causes junction leakage currents.

The problems associated with forming a silicide layer on a silicon diffusion layer or any other silicon layer or substrate have been addressed by the prior art. For example, prior to silicidation, silicon substrates can be dipped in hydrofluoric acid (aqueous solution of hydrogen fluoride, HF) to provide a $SiO_2$ free silicon surface for silicidation. This method (HF treatment) is widely used to remove $SiO_2$ and other materials from the surface of a substrate. However, this method is not satisfactory because the HF treated silicon surface is unavoidably exposed to the atmosphere during wafer handling from a HF rinse tool to a metal deposition tool, resulting in growth again of a thin $SiO_2$ layer on the silicon surface due to oxygen in the atmosphere. The HF treatment should be rendered in concert just before the metal deposition to avoid undesirable oxide growth; however, immediate transition from the HF treatment step to the metal deposition step is difficult in view of the constraints of maneuvering each of the tools.

Other means to remove surface $SiO_2$ include inverse sputtering methods, in which the silicon surface is exposed to a bombardment of energized particles in order to sputter $SiO_2$ off the surface. This treatment can be done in the same chamber as the metal deposition allowing for immediate transition from inverse sputtering to metal deposition without exposing the substrate to the atmosphere. However, in this method, the flux of the impinging particles is low (not efficient) and the energy of the particles is high which can cause damage to the silicon substrate. Furthermore, with a thin diffusion layer (a shallow junction), the damage can reach to the junction of the diffusion layer and the underlying substrate and induce leakage currents through the junction. Another disadvantage is that certain gases, such as carbon-containing gases, can introduce impurities which are then incorporated into the metal layer during subsequent metal deposition step. In order to keep the chamber impurity-free, inert gases such as Ar and Xe must be used to perform the inverse sputtering.

A different approach to form a silicide layer on a thin diffusion layer deposits an additional silicon layer on the diffusion layer to compensate for silicon consumed during the silicidation process. A silicide layer can then be formed as if the silicide layer was formed in the thin diffusion layer without consuming the diffusion layer. Such an approach somewhat mitigates difficulties associated with a thin diffusion layer.

In constructive application, a silicidation reaction is desired only on selected diffusion layers, such as source/drain regions of MOSFETs. However, if silicon is also deposited on sidewalls between the gate electrode and source/drain regions, this silicon also reacts with the metal to form a silicide, which causes an electrical short between the gate electrode and source/drain regions. In order to avoid such electrical shorts, a silicon layer should be selectively deposited only on source/drain regions and the gate electrode (i.e., elevated source/drain MOSFETs structure), but not on the sidewall insulator and other insulators for electrical isolation (such as field $SiO_2$). Such a selective silicon deposition can be accomplished by employing an epitaxial growth technique. However, this technique is difficult since it is very sensitive to the surface condition of the substrate.

The thickness of a deposited silicon film will depend on surface roughness and crystalline structure of the underlying substrate. For instance, if several types of diffusion layers are present, each of these diffusion layers may have different characteristics. As a result, the silicon layer deposited on different diffusion layers may vary in thickness. Further, the presence of any impurities or $SiO_2$ on the surface of the diffusion layers will adversely affect the deposition process.

To achieve optimum performance, application of the silicide film should be precisely controlled so as to consume all of the deposited silicon layer but not to consume silicon of the diffusion layer. The deposited silicon layer should be consumed because it has a much higher electrical resistivity than the diffusion layers. However, variations of silicon layer thickness makes it impossible to deposit an appropriate thickness of metal film for the silicidation process to consume the deposited silicon.

To overcome difficulties associated with preferential progress of silicidation along a specific crystal orientation, amorphization of the silicon surface has been used. For example, ion implantation (such as Ar or Si ion implantation) into a silicon substrate before the metal deposition destroys the crystal structure of the silicon surface. An amorphous layer has no specific order in atomic arrangement and thus has no special or preferential direction, and silicidation does not progress along a specific crystal orientation. However, low energy (less than 500 eV) and high dose ion implantation is not available; thus amorphization by ion implantation is inefficient and, as with inverse sputtering, will damage the silicon substrates.

As explained above in detail, there is a great need for an effective treatment of silicon surface to inhibit $SiO_2$ formation, including an appropriate surface treatment prior to silicidation. There is also a need for an effective treatment of a silicon surface to promote formation of a smooth and even silicide layer.

SUMMARY OF THE INVENTION

The present invention is directed to a method for inhibiting silicon oxide growth on a silicon surface. The process is particularly useful in conjunction with forming of a silicide film on a very thin diffusion layer and/or formation of elevated source/drain MOSFETs.

In accordance with the present invention, carbon is incorporated into the silicon surface to form a thin carbon-containing silicon surface layer by exposing the surface to a carbon-containing plasma. The carbon-containing silicon surface layer inhibits oxidation of the silicon. Ion bombardment from the plasma also produces a thin amorphous layer on the silicon surface which prevents inhomogeneous progress of silicidation along a crystal plane. Thus, a smooth and even silicide layer can form through the carbon-containing silicon layer.

The present invention is also directed to a method to selectively form silicon layers only on horizontal surfaces of certain features on a substrate. In this process, a uniform silicon layer is formed conforming to the surfaces of the features (i.e., on both horizontal surfaces and vertical surfaces). Then the features are exposed to carbon-containing plasma. As in Reactive Ion Etching (RIE), carbon is impinged at a normal angle to the substrate, resulting in treatment (formation of an anti-oxidation layer) of only the horizontal surfaces. Oxidation can then proceed on the silicon layers on the vertical surfaces; if desired, whereby the silicon on the horizontal surface stays intact due to the anti-oxidation layer. The resulting oxide layer on the vertical surfaces may be stripped using, for example, an HF treatment, or the oxide layer can be used as an insulator film.

It is to be understood that both the foregoing general description and the following detailed description are exemplary and explanatory only and are not restrictive of the present invention as claimed.

DETAILED DESCRIPTION OF THE PREFERRED EMBODIMENTS

(1) Anti-Oxidation Layer Information

The present invention is directed to a method for inhibiting growth of $SiO_2$ on silicon. For discussion purpose only, specific reference will be made to a silicon substrate although the invention will not be limited in this respect. The silicon may be any silicon used in the art such as an amorphous, poly, or crystal silicon layer or silicon substrate. The silicon substrate may be any substrate within the skill of the art such as bulk silicon wafers or SOI wafers. The silicon layer may be a silicon diffusion layer.

Figure 1:
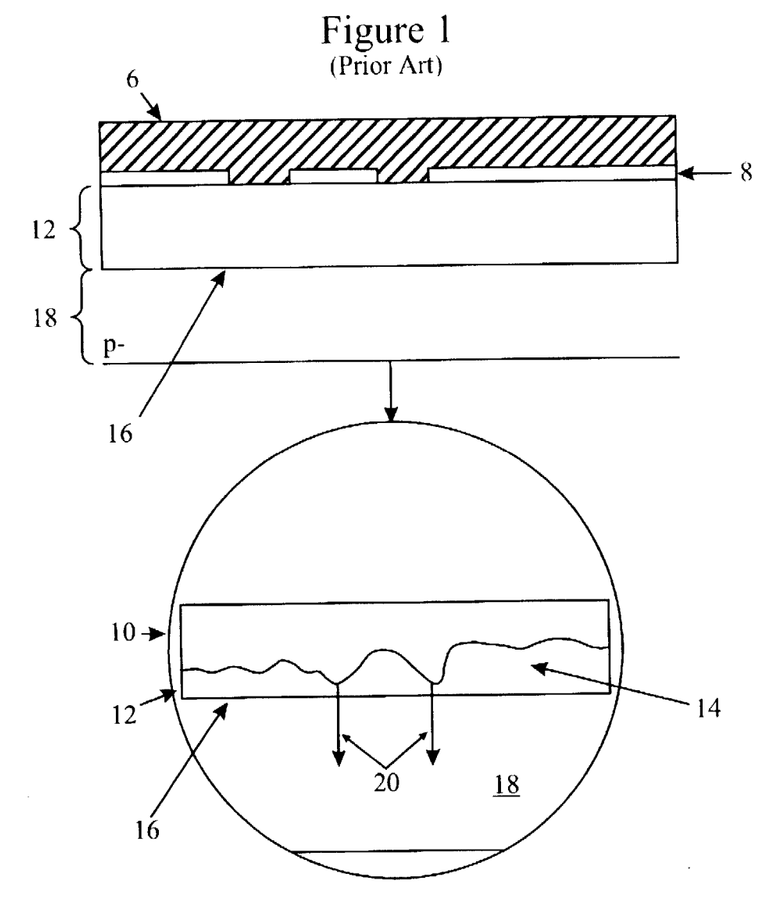
FIG. 1 illustrates a formation of thin silicide film on a thin diffusion layer with a poor silicide/silicon interface.

FIG. 1 depicts the formation of a thin silicide film (10) formed by silicidation of a metal (6) on a thin silicon diffusion layer (12) having an inhomogeneous $SiO_2$ surface (8). The silicide/silicon interface (14) is ragged, uneven, and irregular due to a thin, fragile, and inhomogeneous $SiO_2$ surface on the silicon diffusion layer and due to preferential silicidation progress along a specific crystal direction. Some protruded portions of the silicide film into the diffusion layer may come close to or penetrate the junction (16) between the silicon diffusion layer and silicon region (18) below the diffusion layer and thus induce junction leakage (depicted by arrows (20)).

The method of the present invention produces a very thin (<100 Å) carbon-containing silicon layer on the surface of a silicon or layer using a carbon-containing plasma. The resulting carbon-containing silicon layer inhibits oxidation on the silicon surface and also provides a slightly amorphized surface.

The carbon-containing plasma can be produced in any effective manner within the skill of the art. The carbon source may be any source capable of providing carbon particles into the plasma. For example, the carbon-containing plasma can be formed by injecting a carbon-containing gas such as $CF_4$, $CHF_3$, $CCL_4$ and/or $CH_4$ into the plasma. Alternatively, the carbon-containing plasma may be generated using a carbon-containing material (e.g., carbon or silicon carbide) in an argon plasma. The carbon also may be incorporated into a silicon substrate or layer during plasma processing such as RIE from a photoresist mask applied to the substrate.

Due to a positive self-bias the plasma develops against surrounding material (e.g., chamber wall and silicon substrate) to sustain its plasma phase, any positively charged carbon particles will impinge on the substrate or layer vertically. No matter what form the impinging carbon particle, once it hits the silicon surface, it will break up to individual atoms, and scatter into the silicon matrix. The carbon atom incorporated into the silicon tends to form some chemical bonding (C-Si) with the nearest silicon atom(s). Although not wished to be bound by any particular theory, it is believed that the chemical bondings of carbon atoms with surrounding silicon atoms inhibits silicon oxidation.

Figure 2:
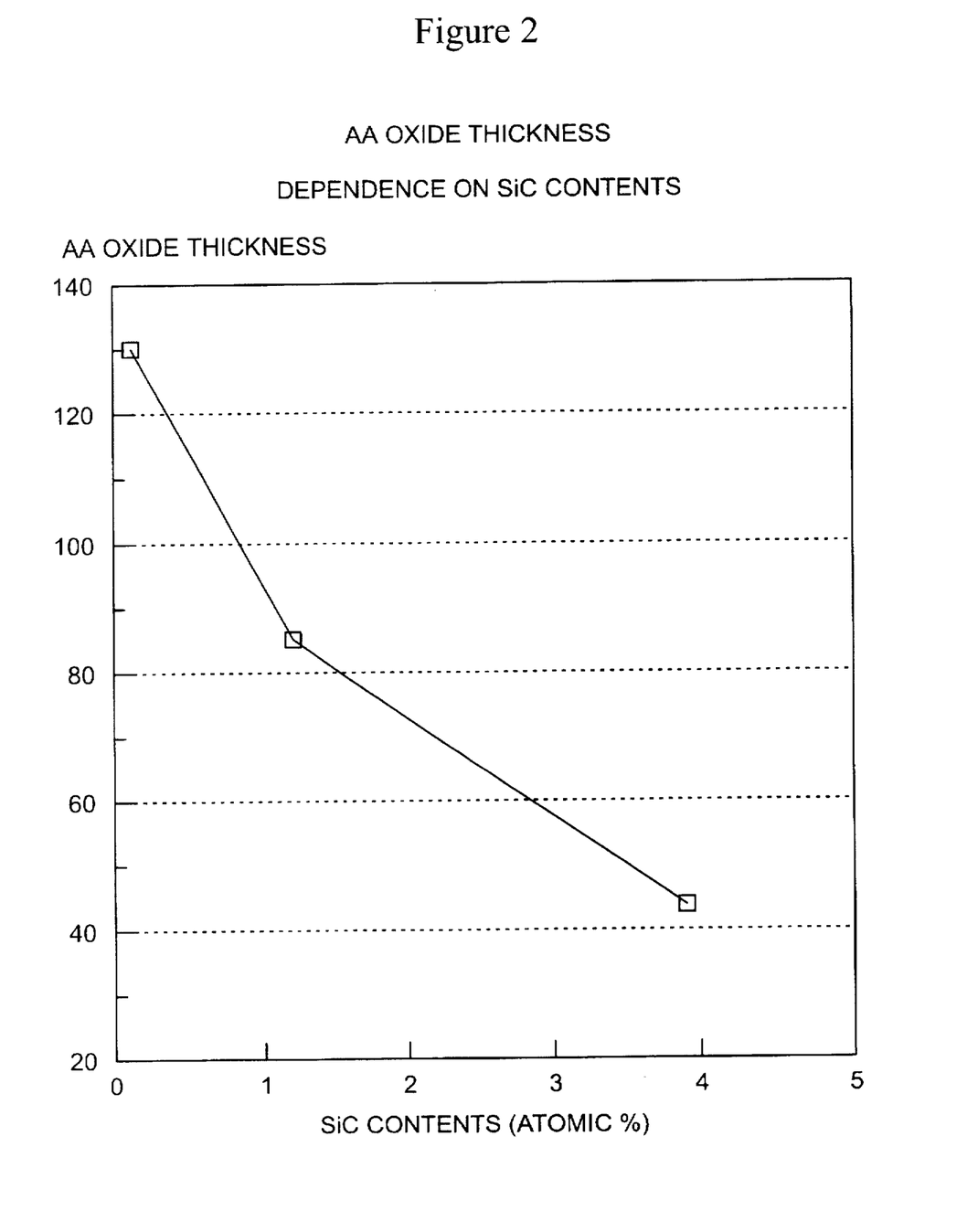
FIG. 2 describes the oxidation inhibition ability of a carbon-containing silicon layer. Oxide thickness after 1000° C. dry oxidation for 5 minutes was plotted as a function of carbon contents incorporated in the silicon surface.

FIG. 2 shows oxide thickness after an oxidation at 1000° C. for 5 minutes as a function of the amount of carbon atoms forming chemical bonds to silicon. The amount of carbon atoms is measured by atomic % of C-Si detected by XPS (X-ray Photoemission Spectroscopy). 1 atomic % C-Si means that on average there is 1 carbon atom with chemical bondings to silicon in every 99 silicon atoms at the surface layer. Even at the extreme condition of oxidation at 1000° C., as little as 1 atomic % C-Si provided significant ability to suppress oxidation. Under more moderate conditions such as exposure to atmosphere at 25° C., the ability to inhibit oxidation by carbon incorporation is even greater.

Theoretically, the carbon concentration at the surface can be as high as 50 atomic %. At this concentration, the ratio between silicon and carbon is 1:1, and the silicon surface is completely turned into silicon carbide, which is well known for its intransigence against oxidation. However, for subsequent silicidation processes, the carbon concentration at the silicon surface is preferably small and localized at the very surface of the silicon.

The heat of formation of SiC (about 15 Kcal/mole) is lower than typical heat of formation of silicide ($TiSi_2$:32 Kcal/mole, NiSi: 20 Kcal/mole, $CoSi_2$:24 Kcal/mole). Therefore, the silicidation reaction itself is not affected by the existence of carbon at the surface of the silicon. On the other hand, if too much carbon is incorporated into the silicide, increased resistivity of the silicide may result since the carbon becomes a significant impurity. For example, 1 atomic % carbon incorporated to a depth of about 20 Å into the silicon surface will result in about 0.1–0.2 atomic % carbon impurity in the silicide after 200 Å silicidation. In this case, the small amount of impurity will not affect resistivity of the silicide significantly (less than 1% increase of resistivity).

Preferable carbon concentrations and thicknesses of the carbon-containing surface layer can be determined by one of skill in the art, in view of the desired silicide thickness and resistivity. In practical terms, for silicidation, a carbon-containing silicon layer having a concentration between about 1 atomic % and 50 atomic % and having thickness between about 10 Å to 50 Å is sufficient for most applications. However, it is to be understood that these numbers are exemplary and explanatory only and do not limit applications of the present invention as a general anti-oxidation layer formation method.

The thickness and concentration of the carbon-containing silicon surface layer can be controlled by adjusting the plasma conditions for carbon incorporation, such as the flow rate of carbon-containing gas, pressure, power, magnetic field, bias applied to the pedestal, temperature of the chamber wall and the substrate, material of the chamber wall and other parts, amount of carbon-containing material in the wafer, time of the plasma treatment, etc. Adjusting these plasma conditions is within the skill of the art, and will control number density of carbon-containing particles and self bias of the plasma. The thickness and concentration of the carbon-containing silicon surface layer can be adjusted to achieve the desired silicidation. For example, a carbon ion imparted with 1000 eV kinetic energy can be implanted 50 Å deep inside silicon matrix. With 300 eV, a carbon ion can be implanted 20–30 Å deep.

Other methods can also be used to incorporate carbon into the surface of a silicon substrate. For example, a thin carbon layer can be applied to a silicon substrate by sputtering, and then the wafer can be exposed to a plasma. Impinging ions from the plasma will "knock-on" or incorporate the carbon atoms into the underlying silicon substrate. Low energy ion implantation may also serve to incorporate the carbon particles into the silicon.

(2) Application to Device Fabrication Processes

After the carbon-containing silicon surface layer is formed, the substrate may be further treated in any suitable manner, for example, by silicidation. Metals such as Co, Ni, Mo, W, and Pt, can be deposited by sputtering. Successive heat treatment causes a silicidation reaction between the silicon and the metal. This process may be carried out in a self-aligned manner (SALICIDE process).

The metal can be deposited all over a wafer or substrate containing MOSFET or other devices, but silicidation only proceeds selectively at areas where silicon and metal are in direct contact, thus a silicide layer will form on source/drain regions and gate electrodes but not on the gate sidewall insulators and other insulators for device isolation. Unreacted metal on these insulators can be stripped off by dipping the wafer into solutions of, for example, $HNO_3$, or $H_2SO_4$ and $H_2O_2$.

If an anti-oxidation layer is formed at the silicon surface prior to the metal deposition as in the present invention, there is no impairment of the silicidation reaction by $SiO_2$ on the silicon surface. Homogeneous initiation of the silicidation is also promoted by the slight amorphization associated with the anti-oxidation layer formation. Thus, in accordance with the present invention, a smooth and stable silicide layer can be successfully formed on very thin diffusion layers required for small geometry devices in ULSI.

The present invention is also directed to a method for selectively forming uniform and electrically isolated silicon layers on horizontal surfaces of particular features on a substrate. A uniform (even thickness) silicon layer is deposited to conform to both horizontal surfaces and vertical surfaces of a substrate at a low temperature and a low pressure. Forming a uniform silicon layer and silicon deposition techniques are within the skill of art.

The substrate is then exposed to a carbon-containing plasma which preferentially forms a carbon-containing anti-oxidation layer on the horizontal surfaces of the silicon layer but not on vertical surfaces. The horizontal plane is subjected to carbon bombardment while the vertical plane is free from carbon incorporation. This is due to a positive self-bias that the plasma develops against surrounding material so that the carbon particles impinge vertical on the horizontal surfaces of the substrate.

Subsequent oxidation of the substrate results in oxidation of the silicon on the vertical surfaces but not on the horizontal surfaces since the horizontal surfaces are protected by the anti-oxidation layer. Resulting oxide on the vertical surfaces may be stripped away by techniques known in the art such as HF treatment, or may be used as a insulating sidewall. Thus, the present invention provides uniform and electrically isolated silicon layers only on horizontal surfaces without the difficulties associated with selective silicon deposition techniques.

Example of a Preferred Embodiment

As depicted in FIGS. 3a-3g, a particular embodiment of the present invention is a fabrication process of elevated source/drain MOSFETs with SALICIDE technology.

Figure 3:
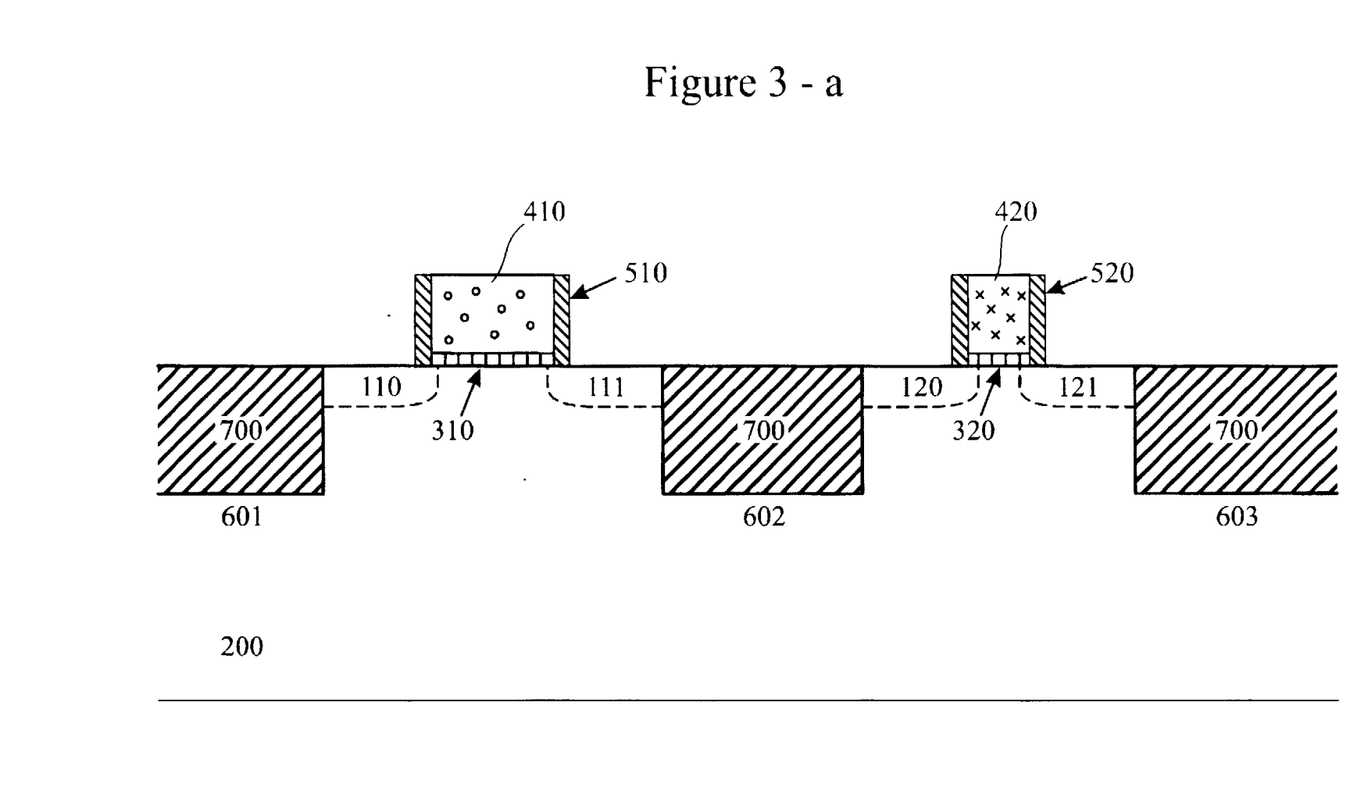
FIG. 3a–3g depicts the application of carbon-containing layers on horizontal surfaces during fabrication of elevated source/drain MOSFETs and a subsequent self-aligned silicidation (SALICIDE) process.

FIG. 3a illustrates a cross section of typical MOSFET having source/drain regions 110, 111, 120, and 121 (i.e., diffusion layers) formed in crystal silicon substrate 200, gate insulators 310 and 320, gate electrodes 410 and 420, gate sidewall insulation 510 and 520 and shallow trenches 601, 602, and 603 filled with isolation insulator 700. The materials for forming the specific features are well within the skill of the art. For example, the gate electrodes may be formed of polycrystal (poly silicon), the gate insulators may be formed of thermal $SiO_2$, the gate sidewall insulators may be formed of nitride $Si_3N_4$, and the isolation insulator may be formed of $SiO_2$ deposited by chemical vapor deposition (CVD) technique. The fabrication process of such MOSFETs is within the skill of the art.

As illustrated in FIG. 3b, the features on the substrate are exposed to a carbon-containing plasma 800, such as an Ar plasma with a carbon clamp ring as a source of carbon. As a result, carbon-containing anti-oxidation layers 801, 802, 803, 804, 805, and 806 are formed on source/drain regions and gate electrodes.

Then, as shown in FIG. 3c, a uniform silicon layer 900 is formed to conform to the exposed features. The thickness of the silicon layer is within the skill of the art and typically is about 400 Å. The silicon layer 900 may be formed, by any technique within the skill of the art such as by CVD with $SiH_4$ gas at 0.2 Torr, 600° C. Without anti-oxidation layers 801, 802, 803, 804, 805, and 806, thin $SiO_2$ layers would be formed on source/drain regions and gate electrodes before and during CVD. $SiO_2$ sandwiched between the silicon surfaces and silicon layer 900 deposited thereon would then impede proper electrical connection between source/drain/gate and the silicon layer 900. However, the anti-oxidation layers 801, 802, 803, 804, 805, and 806, prevents formation of a thin $SiO_2$ and allows proper electrical contacts.

Figure 3D:
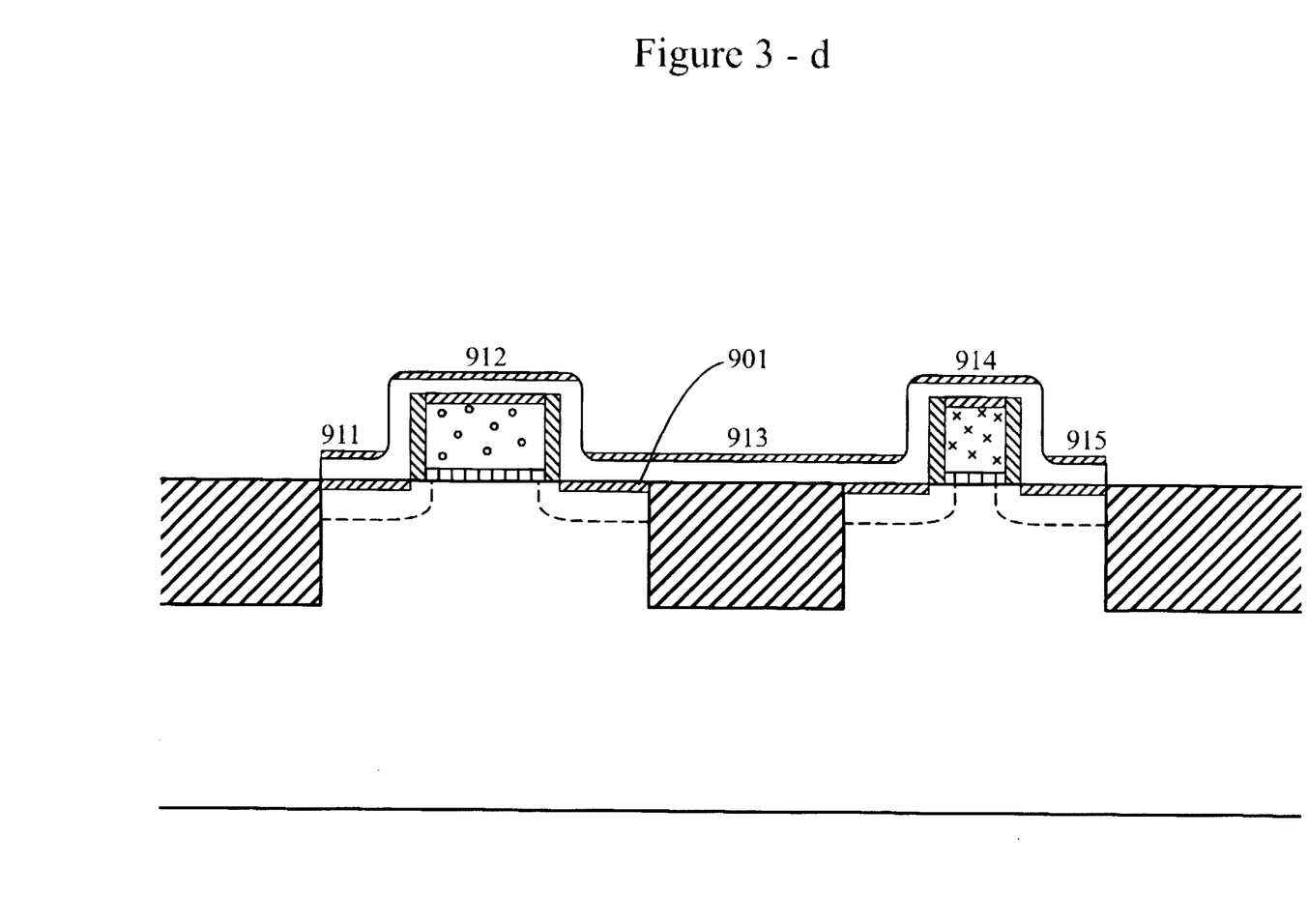

Referring to FIG. 3d, any undesired portion of silicon layer 900 may be removed by any manner known in the art. Some portion of silicon layer 900 on isolation insulator 700 may remain unremoved to be utilized as a local interconnection to adjacent devices. The substrate is exposed to carbon-containing plasma 800 and anti-oxidation layers 911, 912, 913, 914, and 915 are formed only on the horizontal silicon surfaces.

Figure 3E:
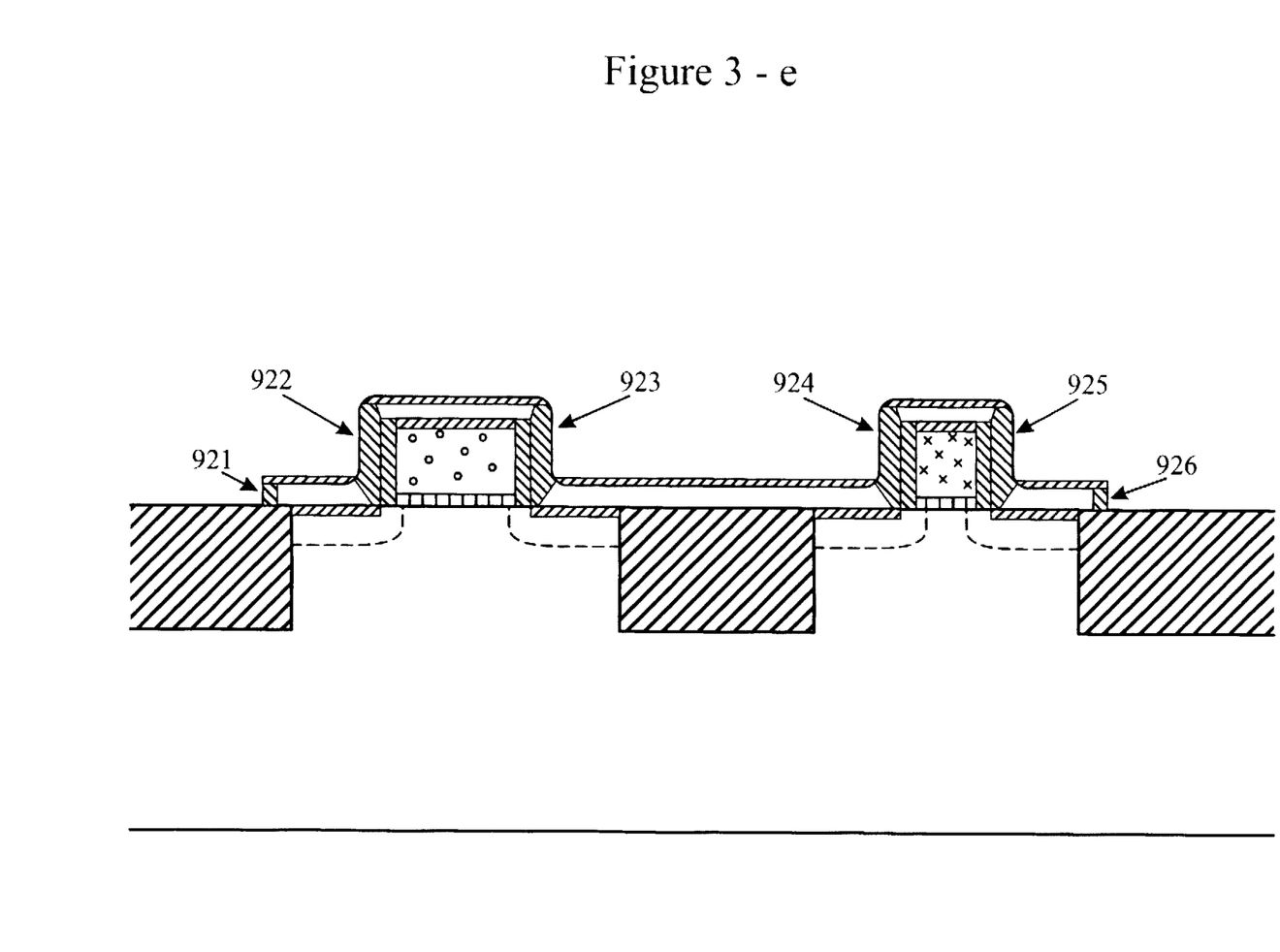

Referring to FIG. 3e, oxidation will selectively oxidize silicon layers on vertical surfaces and turn them into oxide surfaces 921, 922, 923, 924, 925, and 926. Effective oxidation procedures are within the skill of the art such as wet oxidation at 800° C. for 20 minutes. The silicon on the horizontal portion is protected by anti-oxidation layers, 911, 912, 913, 914, and 915. The gate electrodes are protected by sidewalls nitride 510 and 520. Unlike selective silicon deposition, electrically isolated, uniform silicon layers of even thickness are obtained on horizontal surfaces.

Figure 3F:
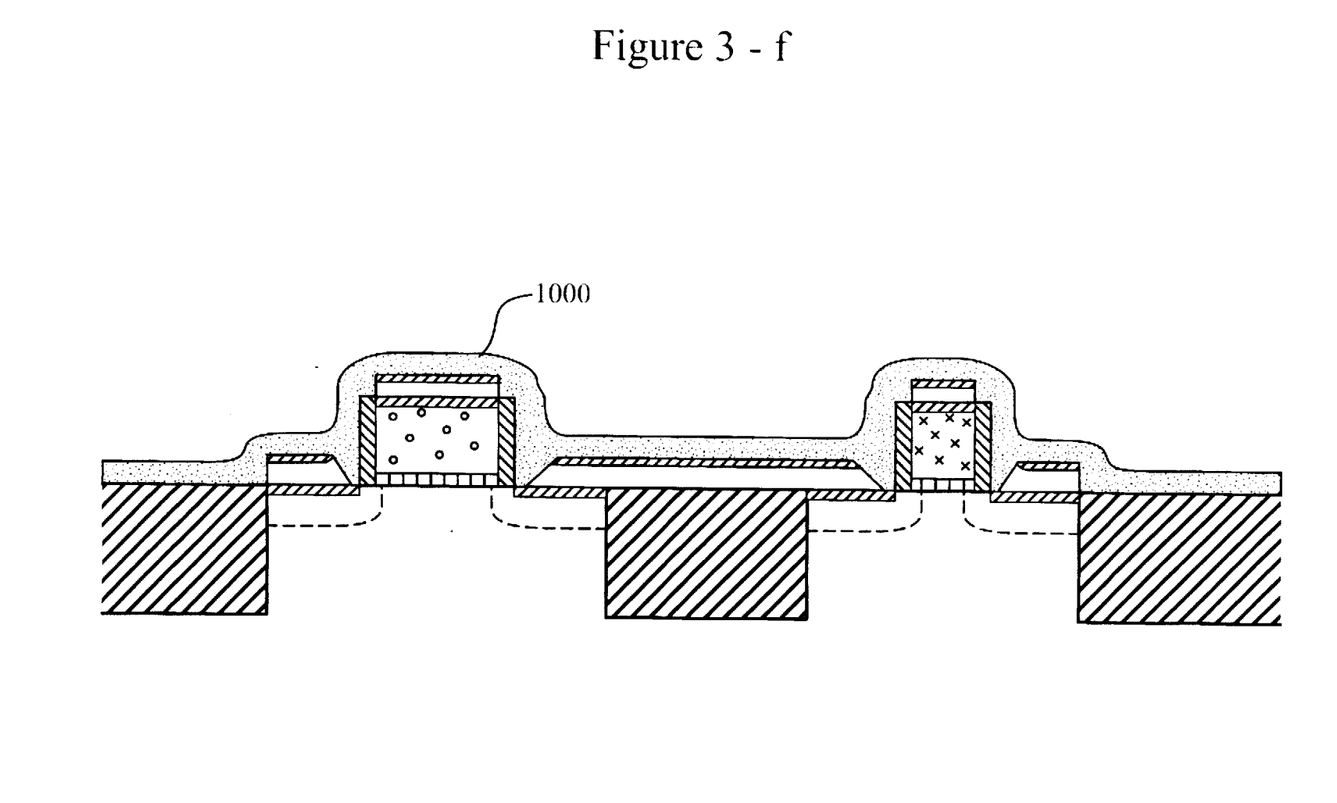

Then oxide 921, 922, 923, 924, 925, and 926 may be removed, if desired by any effective treatment within the skill of the art, such as HF treatment. Carbon plasma treatment is repeated if necessary. As shown in FIG. 3f, metal film 1000 is deposited on the substrate by techniques within the skill of the art, such as sputtering. The type of metal, e.g., Co, and the thickness is within the skill of the art. A typical thickness may be 110 Å.

Rapid thermal annealing (RTA) technique, such as at 500° C. in nitrogen ambient, promotes silicidation in areas where the metal and silicon are in direct contact (i.e., at 911, 912, 913, 914, and 915). A smooth and even silicide film is formed on the $SiO_2$ free and slightly amorphized surfaces due to carbon-containing anti-oxidation layers, 911, 912, 913, 914, and 915. Unreacted metal on isolation insulator 700 and gate sidewalls 510 and 520 can be removed by rinsing the wafer in a solution of $HNO_3$. Further thermal treatment, for example, at a higher temperature of 700° C., may be rendered to stabilize the silicide film. Silicon film 900 is completely turned into a silicide films, such as $CoSi_2$, 1001, 1002, 1003, 1004, and 1005. A typical, nonlimiting, silicide thickness is about 390 Å. No silicon in the source/drain regions is consumed. FIG. 3g shows the resulting SALICIDE structure on elevated source/drain MOSFETs with silicide local interconnection 1003.

Although illustrative embodiments of the present invention have been described in detail with reference to the accompanying drawings, it is to be understood that the invention is not limited to those precise embodiments and that changes and modifications may be effected therein by those in the art without departing from the scope and spirit of the invention.

I claim:

1. A method for forming an oxidation layer on the vertical surfaces of an elevated semiconductor structure having vertical and horizontal surfaces, the method comprising forming a silicon layer on both vertical and horizontal surfaces of the elevated structure; forming a carbon-containing silicon surface layer on the portion of the silicon layer on the horizontal surfaces by plasma carbon treatment whereby the carbon-containing silicon surface layer inhibits oxidation on the horizontal surfaces and provides an amorphized surface; and oxidizing the portion of the silicon layer on the vertical surfaces thereby forming an oxide.

2. The method of claim 1 further comprising subjecting the carbon-containing silicon surfaces to salicidation.

3. The method of claim 1 wherein the elevated semiconductor structure is an elevated source/drain structure.

4. The method of claim 1 further comprising stripping the oxide from the vertical surfaces.

5. A method for inhibiting oxidation and forming an amorphized surface, comprising applying a carbon layer to an element forming silicon region and an element isolating insulator region and then impinging ions on to the carbon layer to incorporate carbon atoms into the element forming silicon region to form a carbon-containing silicon surface layer on the element forming silicon region; wherein the carbon-containing silicon surface layer inhibits oxidation and provides an amorphized surface.

6. The method of claim 5 wherein the element forming silicon region and the element isolating insulator region have a coextensive surface.

* * * * *